United States Patent [19]

Amitai et al.

[11] Patent Number: 5,673,277
[45] Date of Patent: Sep. 30, 1997

[54] SCAN TEST CIRCUIT USING FAST TRANSMISSION GATE SWITCH

[75] Inventors: Zwie Amitai, Sunnyvale; Mark Muegge, Santa Clara, both of Calif.

[73] Assignee: Quality Semiconductor, Inc., Santa Clara, Calif.

[21] Appl. No.: 732,952

[22] Filed: Oct. 17, 1996

Related U.S. Application Data

[63] Continuation of Ser. No. 123,481, Sep. 16, 1993, abandoned.

[51] Int. Cl.$^6$ ............................................. G01R 31/317
[52] U.S. Cl. ................................. 371/22.3; 326/16
[58] Field of Search ....................... 371/22.3; 326/16–19, 326/21, 59, 60, 90, 91, 102, 112, 115, 84; 327/288, 394, 581, 63, 64, 404, 434, 435, 430, 424, 425, 427, 408, 409, 199; 379/292; 340/572, 557; 257/391–393; 307/112

[56] References Cited

U.S. PATENT DOCUMENTS

| | | | |
|---|---|---|---|
| 3,184,609 | 5/1965 | Yee | 327/478 |
| 3,325,654 | 6/1967 | Mrazek | 327/427 |
| 3,614,472 | 10/1971 | Kloppenborg | 327/484 |
| 3,617,771 | 11/1971 | Lee | 327/379 |
| 4,004,160 | 1/1977 | Streit et al. | 327/487 |
| 4,096,399 | 6/1978 | Davis et al. | 327/425 |
| 4,245,230 | 1/1981 | Kwok et al. | 257/275 |
| 4,445,051 | 4/1984 | Elmasry | 326/115 |
| 4,477,742 | 10/1984 | Janutka | 327/436 |
| 4,502,027 | 2/1985 | Ayasli | 327/404 |
| 4,577,125 | 3/1986 | Allen | 326/91 |
| 4,628,307 | 12/1986 | Crouse | 340/825.05 |
| 4,633,101 | 12/1986 | Masuda et al. | 327/93 |

(List continued on next page.)

FOREIGN PATENT DOCUMENTS

| | | | |
|---|---|---|---|
| 59-115616 | 7/1984 | Japan | H03K 17/693 |
| 62-15922 | 1/1987 | Japan | H03K 17/687 |
| 1550617 | 3/1990 | U.S.S.R. | H03K 17/687 |
| 2 260 618 | 2/1992 | United Kingdom | H01L 23/52 |
| 2260618 | 4/1993 | United Kingdom | G11C 29/00 |

OTHER PUBLICATIONS

IEEE Standard Test Access Port and Boundary–Scan Architecture, IEEE Computer Society, Inst. of Electrical and Electronics Engineers, Inc., NY, NY, Oct. 21, 1993.

IEEE Standard Test Access Port and Boundary–Scan Architecture, The Inst. of Electrical and Electronics Engineers, Inc., NY, NY, Aug. 1990.

*Family Circuit Characteristics*, Quickswitch Products Databook, 1995, pp. 1–10. (This reference indicates that Quickswitch Bus Switches were introduced in 1990).

PCT/US94/10312, International Search Report dated Dec. 7, 1994.

A. Carlson and D. Gisser, *Electrical Engineering Concepts and Applications*, Rensselaer Polytechnic Institute, Addison–Wesley Publishing Company, pp. 362–365.

R. Gregorian and G. Temes, *Analog MOS Integrated Circuits for Signal Processing*, A Wiley–Interscience Publication, John Wiley & Sons, New York, 1986, pp. 99–117, 462–483.

(List continued on next page.)

*Primary Examiner*—James P. Trammell
*Assistant Examiner*—Hal D. Wachsman
*Attorney, Agent, or Firm*—Wilson Sonsini Goodrich & Rosati

[57] ABSTRACT

A fast transmission, integrated circuit switching device responsive to at least one external on/off control signal, and including a first input/output node, and a second input/output node, the switching device operative to pass or block the bidirectional transmission of external data signals between the first node and the second node, the switching device comprising a bidirectional field-effect transistor; a first scan cell; and a second scan cell; whereby input and output data signals of the switching device may be sensed and stored.

10 Claims, 11 Drawing Sheets

U.S. PATENT DOCUMENTS

| | | | |
|---|---|---|---|
| 4,656,647 | 4/1987 | Hotine | 375/52 |
| 4,704,550 | 11/1987 | Hechtman | 327/409 |
| 4,705,759 | 11/1987 | Lidow et al. | 437/29 |
| 4,716,398 | 12/1987 | Eccleston et al. | 341/118 |
| 4,716,514 | 12/1987 | Patel | 363/127 |
| 4,719,374 | 1/1988 | Bialo | 327/430 |
| 4,810,911 | 3/1989 | Noguchi | 327/431 |
| 4,814,644 | 3/1989 | Yamakawa | 327/64 |
| 4,933,574 | 6/1990 | Chuen-Der Lien et al. | 326/84 |
| 4,959,873 | 9/1990 | Flynn et al. | 455/303 |
| 4,963,733 | 10/1990 | Ayasli | 250/231.16 |
| 4,983,865 | 1/1991 | Ho et al. | 327/404 |
| 5,010,261 | 4/1991 | Steigerwald | 327/404 |
| 5,012,123 | 4/1991 | Ayasli et al. | 307/112 |
| 5,038,051 | 8/1991 | Firman et al. | 327/427 |
| 5,060,037 | 10/1991 | Rountree | 257/357 |
| 5,061,903 | 10/1991 | Vasile | 330/311 |
| 5,062,110 | 10/1991 | Kobayashi et al. | 371/22.3 |
| 5,107,152 | 4/1992 | Jain et al. | 327/431 |
| 5,150,044 | 9/1992 | Hashizume et al. | 371/22.3 |
| 5,161,160 | 11/1992 | Yaguchi et al. | 371/22.3 |
| 5,166,604 | 11/1992 | Ahanin et al. | 371/22.3 |
| 5,182,479 | 1/1993 | Behagel et al. | 327/379 |
| 5,254,974 | 10/1993 | Rebers et al. | 340/572 |
| 5,260,948 | 11/1993 | Simpson et al. | 371/22.3 |
| 5,289,062 | 2/1994 | Wyland | 307/577 |
| 5,317,205 | 5/1994 | Sato | 326/21 |

OTHER PUBLICATIONS

P. Allen and E. Sanchez–Sinencio, *Switched Capacitor Circuits*, Van Nostrand Reinhold Electrical/Computer Science and Engineering Series, New York, 1984, pp. 596–610.

PCT/US92/02168, International Search Report dated Jun. 23, 1992.

PCT/US92/02168, PCT Written Opinion dated Feb. 12, 1993.

PCT/US94/10312, International Search Report dated Dec. 12, 1994.

Data Sheets from Texas Instruments, Advanced BiCMOS Technology Data Book, 1992.

National Semiconductor, Teradyne, IEEE 1149.1—1990 Seminar Handbook, 1992 Edition.

Quality Semiconductor Inc., 1991 Databook, pp. 5–24 to 6–20.

Modern Microelectronic Circuit Design, IC Applications, Fabrication Technology, vol. II, 705–707.

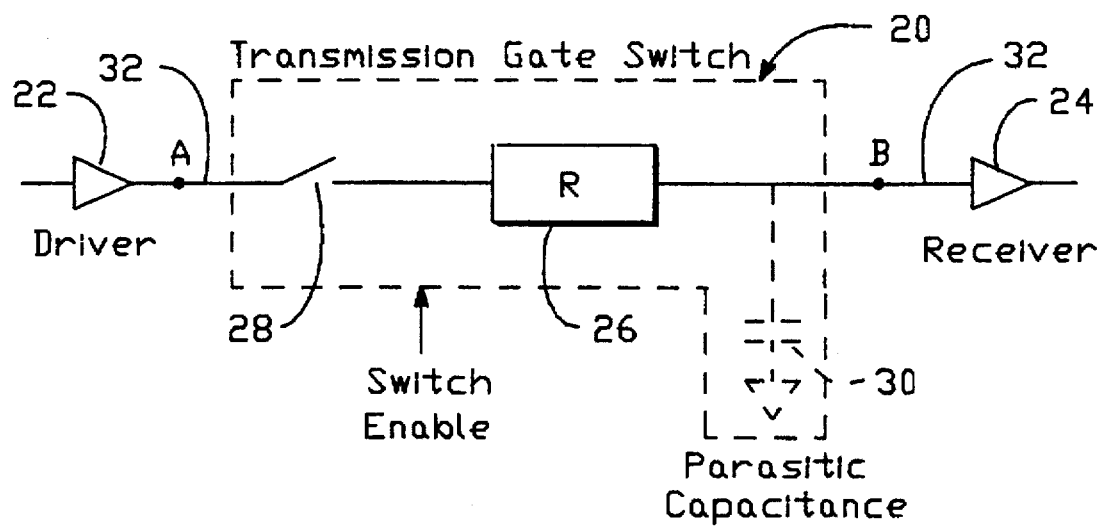
FIG.−1
(PRIOR ART)
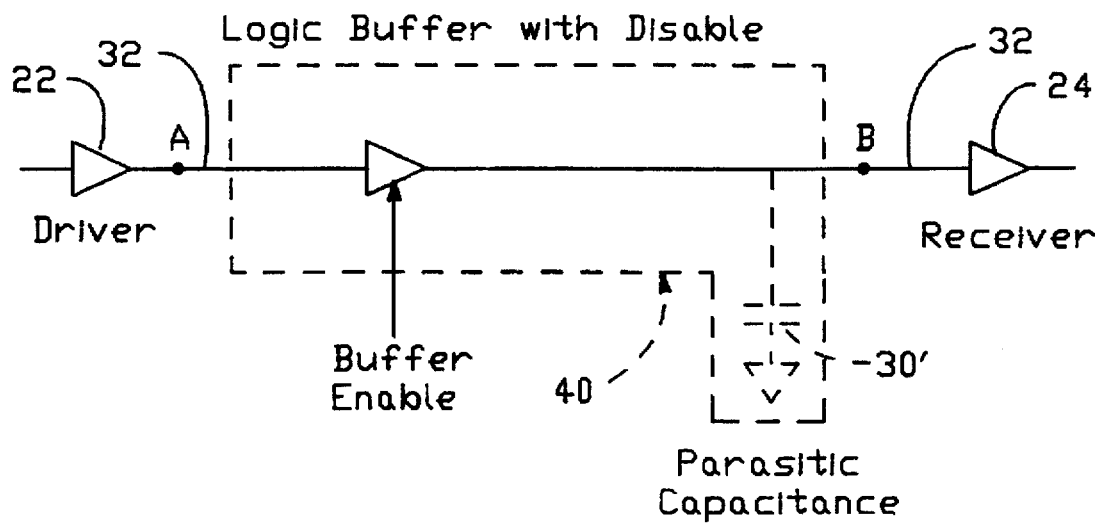
FIG.−2
(PRIOR ART)

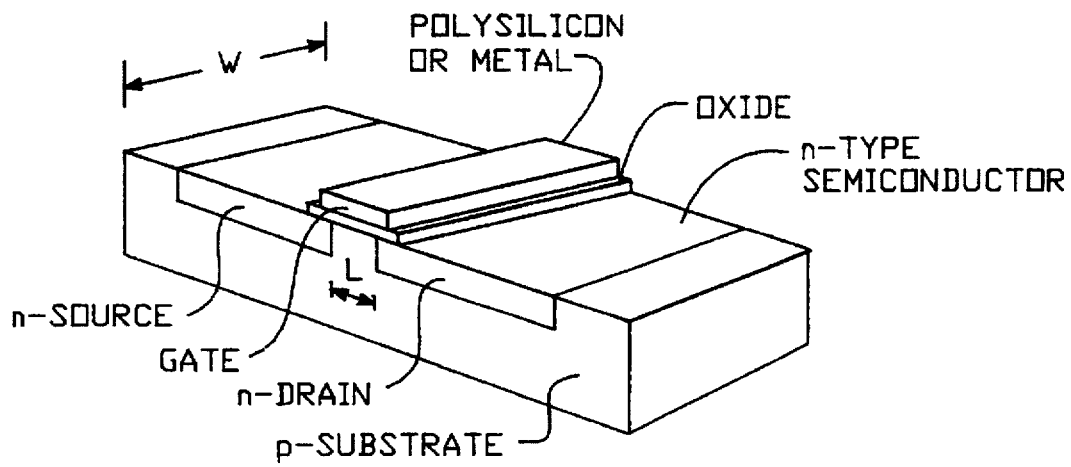
FIG.−3
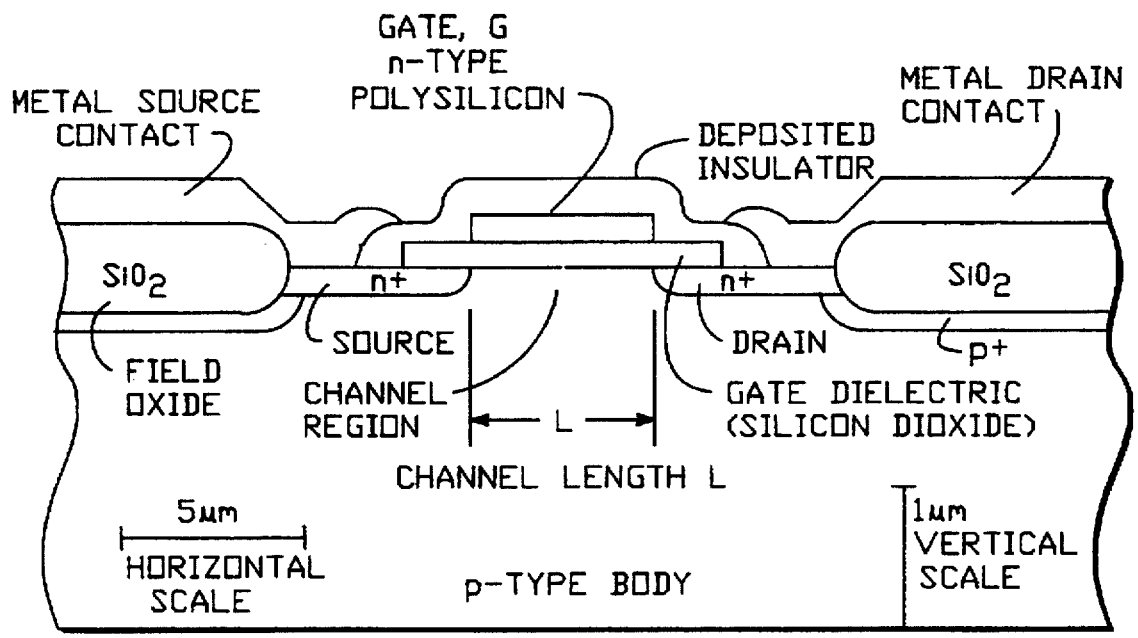
FIG.−4

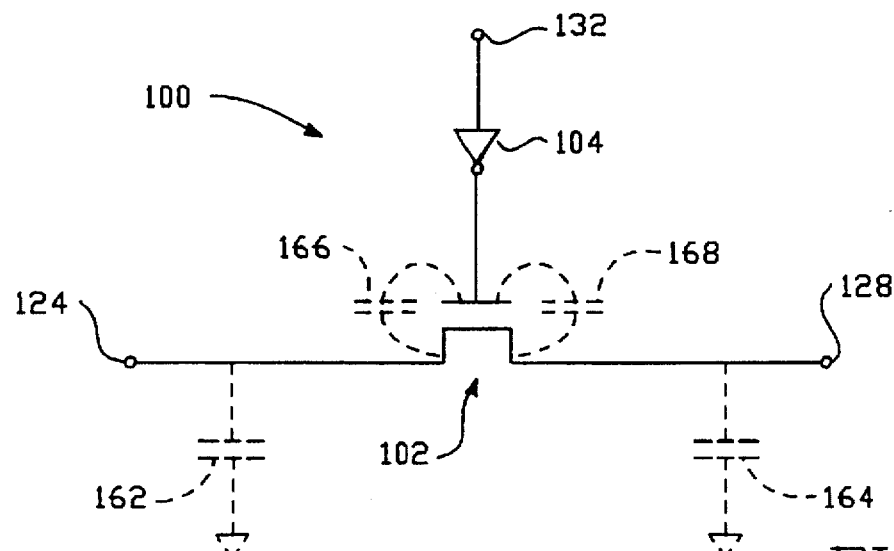
FIG.—5D
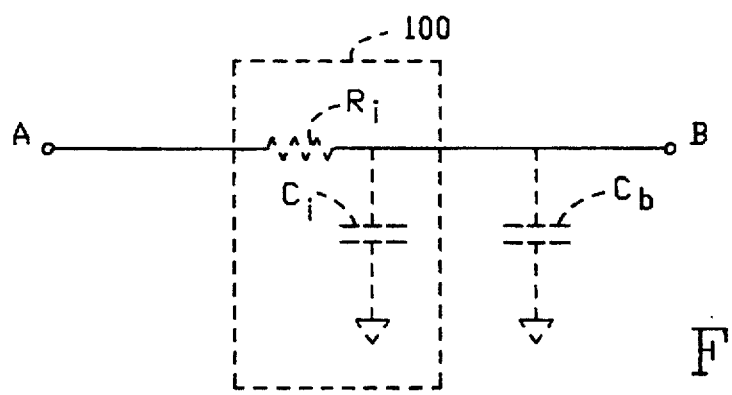
FIG.—5E
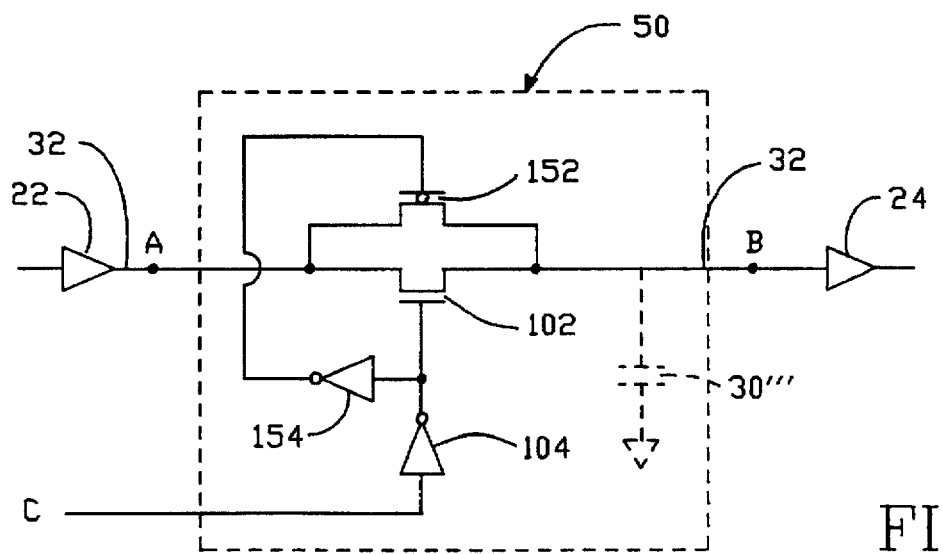
FIG.—6

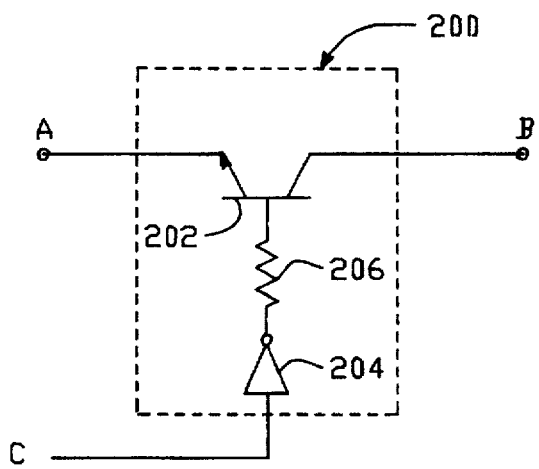
FIG.—7
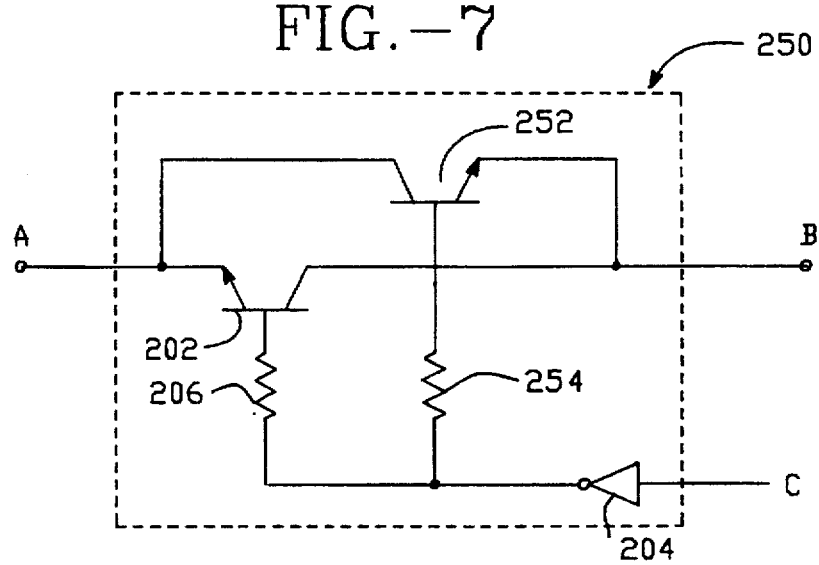
FIG.—8
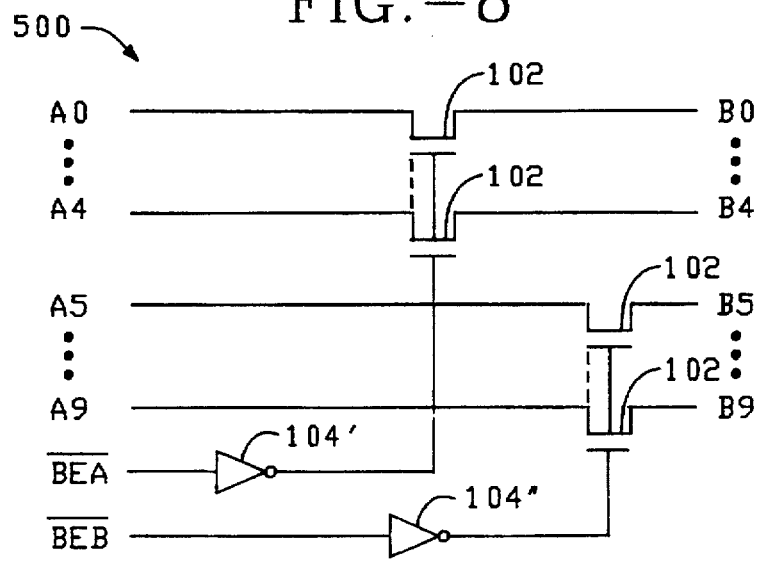
FIG.—9

SCAN TEST CIRCUIT USING FAST TRANSMISSION GATE SWITCH

This application is a continuation of Application No. 08/123,481, filed Sep. 16, 1993, entitled SCAN TEST CIRCUIT USING FAST TRANSMISSION GATE SWITCH, now abandoned.

BACKGROUND OF INVENTION

1. Field of the Invention

The invention relates generally to the testing of electronic systems, comprising integrated circuits that are interconnected to each other, and more specifically to test circuits that include scan cells used to test such integrated circuits and interconnections.

2. Description of the Related Art

In the past, integrated circuits (ICs) have been tested by performing a complete boundary scan. Each pin was physically accessed and tested, one pin at a time. However, as the dimensions of ICs have decreased, it has become increasingly difficult to physically access IC pins for testing. As a result, serial testing methods have been developed. In particular, the Joint Test Action Group Standard (JTAG) was formed and has adopted as a formal IEEE standard, IEEE 1149.1.

The standard requires that an IC include several dedicated pins used for testing. The pins control a serial data path on the IC that provides access to the IC's functional input/output (I/O) structure. Scan cells are disposed along the serial path, one for each I/O pin. Data may be "sensed" or read from any of the IC's functional I/O pins and stored in a corresponding scan cell. The stored values then can be serially shifted out of the IC for examination. Alternatively, the scan cells may also be serially loaded with data values, and the I/O pins then may be "forced" to the values in the scan cells. Thus, inputs and outputs may be forced to certain desired values during testing.

The IEEE 1149.1 Standard has been implemented on application specific integrated circuits (ASICs) as well as on basic logic ICs. However, the IEEE 1149.1 standard still is offered on relatively few ICs. This has posed problems for developers attempting to test subsystems of ICs and interconnects on printed circuit boards, for example.

A subsystem of ICs on a printed circuit board, for example, may be tested in accordance with the IEEE 1149.1 standard if every IC in the subsystem that accepts inputs to the subsystem and every IC providing outputs from the subsystem has the circuitry necessary to implement testing in accordance with the standard. However, not all ICs have the scan circuitry required to make them IEEE 1149.1 compliant.

One solution to this problem is to use IEEE 1149.1 compliant buffers in the subsystem. The inputs and outputs of these buffers can be forced or sensed as they pass through the buffer. Buffers have been available in the past for this use. For example, there is the 8244 buffer produced by Texas Instruments, the SCAN 18244 produced by National Semiconductor, and the QS 618 244 produced by Quality Semiconductor, the Assignee herein.

While these earlier IEEE 1149.1 complaint buffers generally have been acceptable, there have been shortcomings with their use. In particular, for example, the buffers may draw power, and in many applications this power penalty may be significant. Also, often there is a speed penalty; the buffers introduce a delay into the system. At times the circuit board may have to be redesigned to account for the delay. Furthermore, some applications may require data to flow bidirectionally between subsystems. For such applications, a bidirectional switch that is largely passive when closed is desirable.

Thus, there has been a need for an IEEE 1149.1 compliant buffer that is bidirectional, has low power consumption and introduces little if any delay. The present invention meets this need.

SUMMARY OF THE INVENTION

In order to overcome the above-discussed disadvantages of known test methods, one aspect of the present invention relates to a fast transmission integrated circuit buffer device with scan cells. The buffer device has two input/output nodes and is operative to pass or block the bidirectional transmission of external data signals between the nodes. The switching device comprises a bidirectional field-effect transistor with a first terminal connected to a first input/output node, a second terminal connected to a second input/output node, and a gate terminal. The transistor passes bidirectional external data signals between the input/output nodes when the transistor is turned on and blocks the passage of external data signals when the transistor is turned off.

Scan cells are connected to each input/output node and are operative to sense and store from, or force data signals to the input/output nodes. The stored data signals may be serially shifted through the scan cells and out a test data output node for testing and examination.

Another aspect of the present invention relates to using a fast transmission integrated circuit switching device for testing subsystems and interconnects on a printed circuit board. Since the buffer device comprises a bidirectional field-effect transistors with the above specified dimensions, it has minimal power consumption and time delay. Further, the device can be implemented as a stand alone device which is well suited for selective placement on a printed circuit, for example, board for testing where access to data signals is not already available.

BRIEF DESCRIPTION OF THE DRAWINGS

These and other features and advantages of the present invention will become more apparent to those skilled in the art from the following detailed description in conjunction with the appended drawings in which:

FIG. 1 is a schematic circuit diagram of an earlier passive transmission gate switch and of a driver and receiver illustrating a conventional design of the switch.

FIG. 2 is a schematic view of an earlier active switch device using an enabled buffer and of a driver and receiver to illustrate another conventional design.

FIG. 3 is a perspective view of a MOS transistor useful for illustrating the invention.

FIG. 4 is a cross-sectional view of the transistor of FIG. 3.

FIG. 5D is a schematic view of the switch of FIG. 5B, illustrating in more detail the capacitances of the switch.

FIG. 5E is a conceptual circuit diagram illustrating the RC delay experienced by a signal propagating from node A to node B to illustrate the invention.

FIG. 6 is a schematic circuit diagram of a fast transmission gate switch and of a driver and receiver to illustrate an alternative embodiment of the invention.

FIGS. 7 and 8 are schematic circuit diagrams of two different transmission gate switches to illustrate additional alternative embodiments of the invention.

FIG. 9 is a schematic view of a bus switch for switching signals between two sets of bus lines.

RELATED PATENT APPLICATIONS

Figure 5A:
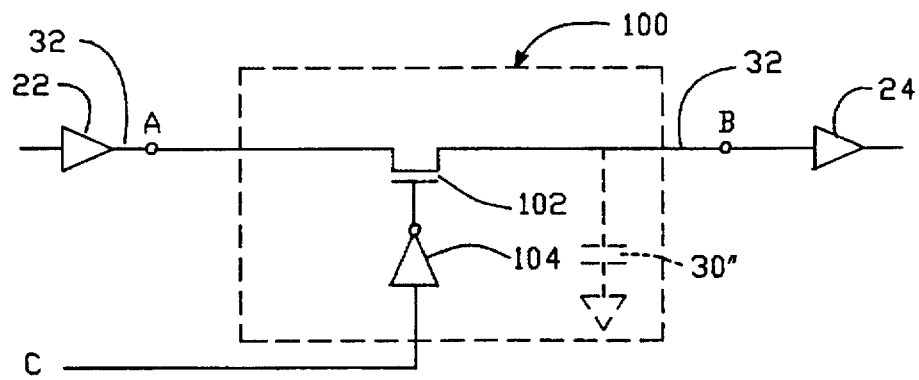
FIG. 5A is a schematic circuit diagram of a fast transmission gate switch and of a driver and receiver to illustrate a preferred embodiment of the invention.

The subject matter described herein relating to the fast transmission gate switch illustrated with reference to FIGS. 1–11A–B is described in commonly assigned patent applications Ser. No. 08/165,234, filed Dec. 10, 1993 which is a continuation of Ser. No. 08/035,873, filed Mar. 23, 1993, now U.S. Pat. No. 5,289,062, which is a continuation of Ser. No. 07/967,956, filed Oct. 27, 1992 (now abandoned) which is a continuation of Ser. No. 07/672,050, filed Mar. 18, 1991 (now abandoned) entitled, Fast Transmission Gate Switch. Each of these patent applications and the patents that may issue thereon, including U.S. Pat. No. 5,289,062, are expressly incorporated herein by this reference.

DETAILED DESCRIPTION OF THE PREFERRED EMBODIMENT

The present invention comprises a novel method and apparatus for the testing of electronic circuits. The following description is presented to enable any person skilled in the art to make and use the invention. Descriptions of specific applications are provided only as examples. Various modifications to the preferred embodiment will be readily apparent to those skilled in the art, and the generic principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Fast Transmission Gate Switch

FIG. 1 is a schematic circuit diagram of a conventional transmission gate switch 20 connected to the output of a driver 22 and the input of a receiver 24 at nodes A, B respectively. The signal to be switched appears at the output of driver 22. When switch 20 connects nodes A and B, such signal is transmitted to node B and appears at the input of receiver 24. Driver 22 and receiver 24 may each be part of another circuit chip package mounted on a printed circuit board where switch 20 is connected by conductive traces 32 through nodes A, B to these chip packages.

Switch 20 has resistance R so that the switch may be represented conceptually as a resistor 26 in series with a pure switch 28 as shown in FIG. 1. A signal propagating between nodes A and B will experience capacitive effects of traces 32 connecting switch 20 and receiver 24, of the receiver 24 and switch 20. Switch 20 is typically employed in the form of an electronic package with pins connected to nodes A, B. As defined on pages 705, 706 of *Modem Microelectronic Circuit Design, IC Applications, Fabrication Technology*, Vol. 2, by staff of Research and Education Association, Dr. Folgiel, Director, Research and Education Association, New York, N.Y., 1981, the parasitic capacitance of an electronic device package with leads or pins can be of two types, inter-lead capacitance and capacitance from lead-to-ground. Switch 20 has three leads, one connected to driver 22, the other connected to receiver 24 by traces 32 on a printed circuit board, and a third lead for the switch enable signal. There will be inter-lead capacitances between the three leads of switch 20, and there will also be capacitances between the three leads of switch 20 and ground.

The above described inter-lead and lead-to-ground capacitances of package 20, those introduced by traces 32 and other board level connections are represented conceptually by capacitor 30 connected between node B and ground and labeled "parasitic capacitance" in FIG. 1. Since this parasitic capacitance represented by the capacitor is inherent in the switch, capacitor 30 is shown in dotted lines. Obviously, the inter-lead capacitances as well as the lead-to-ground capacitances of switch 20 would depend on the size, geometry, material and the exact configuration of the package 20, its leads, and of traces 32 and other board level connections. The total internal capacitance of switch 20 is given by the total capacitive effect of the parasitic capacitance of capacitor 30, and the capacitance of other portions of switch 20, the value of which will depend on the structure of the switch. Therefore, the total capacitance seen by a signal propagating between nodes A and B is given by the effects of the internal capacitance of switch 20, the capacitance of receiver 24, and the capacitance of traces 32 connecting switch 20 to receiver 24. Thus the delay of the signal propagating from node A to node B is caused by two RC delays: (1) the product of the resistance R of resistor 26 and the capacitance of trace 32 connecting switch 20 and receiver and of receiver 24, and (2) the product of the resistance R of resistor 26 and the internal capacitance of switch 20, including that of capacitor 30. The second (2) product will depend on the specific structure of switch 20, and will be omitted for now, since the first product alone makes switch 20 unsuitable for use in high speed switching between logic devices, as will be clear from the discussion below.

In typical printed circuit board designs for computer and logic applications, a typical capacitance of the bus (e.g., that of trace 32, of receiver 24 and other associated circuitry whose capacitance effects will be felt at node B) downstream from switch 20 is about 50 pF. Therefore, if switch 20 has a large resistance value, the RC time constant resulting from such resistance and the typical bus capacitance of 50 pF will be large, resulting in a significant signal delay when the signal propagates from A to B. The propagation delay introduced by the switch is therefore at least equal to the value of the RC time constant. A standard transmission gate switch is the CMOS 4016 integrated circuit. The typical resistance values of existing transmission gate switches such as the 4016 are in the range of 250–1,000 ohms. This type of switch would therefore introduce at least a delay of the order of 12–50 nanoseconds, assuming a 50 pF bus capacitance. Such delay is unacceptable for switching high speed signals required in many computer and logic applications. For this reason, the 4016 type switch is more commonly used in analog circuits and seldom in board level computer or digital logic designs. For the latter applications, active logic devices such as industry standard 74F244 buffers have been used such as shown in FIG. 2. To simplify the discussion, identical components and the figures of this application are identified by the same numerals.

As shown in FIGS. 1 and 2, transmission gate switch 20 has been replaced by a logic buffer 40 in FIG. 2. Driver 22 and receiver 24 may be part of computer or logic chip packages mounted on a printed circuit board and connected to buffer 40 by conductive traces 32 on the board. Buffer 40 is also in the form of a package having inter-lead and lead-to-ground parasitic capacitance, whose values may be different from those of switch 20; for this reason, such parasitic capacitance of buffer 40 are represented by capacitor 30', also shown in dotted lines. Buffer 40, however, introduces a delay of its own because of the inherent speed limitations of active logic. The 74F244 buffer driving a 50 pF load introduces a delay of about 6.5 nanoseconds. Thus while using a logic buffer 40 to replace switch 20 does reduce the delay in signal transmission, it is difficult to further reduce the delay introduced by the buffer itself. It is therefore desirable to provide an improved switching device where the above-described difficulties are alleviated.

FIG. 3 is a perspective view of a fast transmission MOS transistor used in a present embodiment of a buffer circuit in accordance with the present invention. FIG. 4 is a cross-sectional view of the transistor of FIG. 3. As shown in FIGS. 3 and 4, the channel length of a MOS type transistor is the distance L between the source and drain regions of the transistor while the channel width is the dimension W of the transistor in the direction where the cross-sectional configuration of the transistor does not change. Another common definition of the channel length is the width of the gate that overlaps the active region of the transistor between the source and drain. Another common definition of the channel width is the length of the gate overlapping the active region of the transistor between the source and drain.

FIG. 5A is a schematic circuit diagram of a fast transmission gate switch and of a driver and receiver suitable for use in a buffer device in accordance with the invention. As shown in FIG. 5A, the transmission gate 100 includes a N-channel MOS transistor 102 and a driver or gate 104 for controlling the gate of transistor 102 in response to an external signal from node C. The channel length of transistor 102 is preferably less than 1.5 microns, and in some applications preferably less than 1 micron. The channel width of transistor 102 is preferably more than 1,000 microns and in some instances preferably 1,200 microns or more. In reference to FIGS. 3 and 4, by reducing the channel length, the resistance of the resistor is reduced since current carriers have a shorter distance to travel in order to conduct current between nodes A, B. By using a transistor with large channel width compared to the transistors in the 4016 type gate, the resistance of transistor 102 is further reduced in comparison. With the above-described design for transistor 102, it is found that the inherent resistance of transmission gate switch 100 between nodes A, B when the transistor 102 is turned on (on-resistance) can be reduced to a value of less than 10 ohms, although a value of less than 50 ohms may be suitable. Applicant has discovered that in some designs, the resistance of switch 100 when transistor 102 is turned on may be reduced to a value of less than 5 ohms. Shorter channel lengths also result in reduced capacitance of transistor 102. The internal capacitance of the switch 100 and its effect on signal delay will be discussed in more detail below in reference to FIGS. 5B–5E.

Figure 5B:
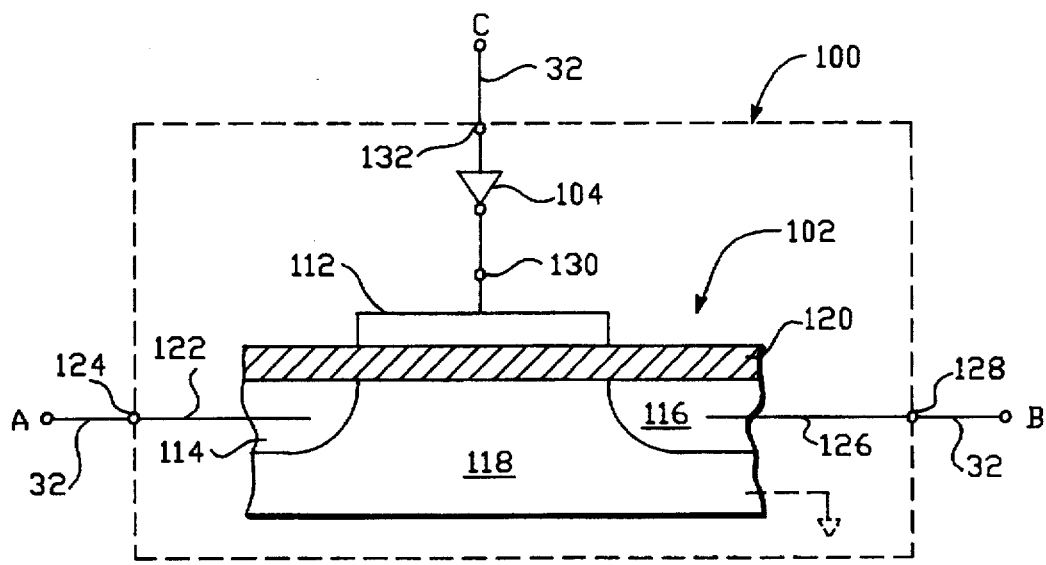
FIG. 5B is a partially cross-sectional view and partially schematic view of the transmission gate switch of FIG. 5A.

FIG. 5B illustrates in more detail the structure of fast transmission gate switch 100 of FIGS. 5A. In FIG. 5B, a partial cross-sectional view of a portion of transistor 102 is shown. Transistor 102 includes a gate 112, drain 114, source 116, and substrate 118 where the gate is separated from the drain and source and substrate by an insulating layer 120. Drain 114 is connected through a conductor 122 through a package body (not shown) of switch 100 to an input/output pin (shown symbolically) at 124. Similarly, source 116 is connected through a conductor 126 through the package body (not shown) to input/output pin 128. Pin 124 is connected to node A of FIG. 5A through trace 32 and pin 128 is connected to node B by means of another trace 32. The output of driver 104 is connected to gate 112 through node 130. The driver receives the switching signal from node C through pin 132. In reference to FIGS. 5A, 5B, the inter-lead parasitic capacitance of switch 100 would be the capacitances between pins 124, 128, 132 and the lead-to-ground parasitic capacitances of switch 100 would be the capacitances of pins 124, 128, 132 to ground. In addition to experiencing such capacitances, a signal passing between pins 124, 128 will also experience the effects of the capacitances between gate 124 on the one hand and the drain 114 and source 116 on the other, as well as capacitances between drain 114, source 116 and substrate 118, referred to as the capacitance of the transistor. The internal capacitance of the switch 100 is given by the total capacitive effects of the capacitance of the transistor and the parasitic capacitance of the switch consisting of the inter-lead and lead-to-ground capacitances and represented by capacitor 30" in FIG. 5A.

The most important components of the above-enumerated capacitances are the lead-to-ground capacitances and the gate to drain and source capacitances. For many commonly used packages, total capacitive effects of the inter-lead and lead-to-ground capacitances are of the order of 8 or 10 pF experienced by signals transmitted through the leads of the package. In one implementation of transistor 102, the gate to drain and source capacitances amount to about 1 or 2 pF and each of the lead-to-ground capacitances of pins 124, 128, 132 amount to about 4 pF. As indicated in the 1991 Data Book, pages 5–24, by Quality Semiconductor, Inc., assignee of the present application, the on internal capacitance of a switch having characteristics similar to that of switch 100 is about 10 pF and its off capacitance is about 6 pF. Thus when transistor 102 is turned off, the internal capacitance seen at either pin 124 or 128 will be the gate to drain and source capacitance and the lead-to-ground capacitance of that particular pin. Whereas if the transistor 102 is on, the internal capacitance seen at either pin would also include the lead-to-ground capacitance of the other pin as well. For this reason, the internal capacitance of switch 100 seen at either pin 124 or 128 will be higher when the transistor is on compared to that seen when the transistor is off. Typically, substrate 118 is connected to ground and node 130 at the output of driver 104 is at a stable DC potential when the transistor is not being turned on or off.

Figure 5C:
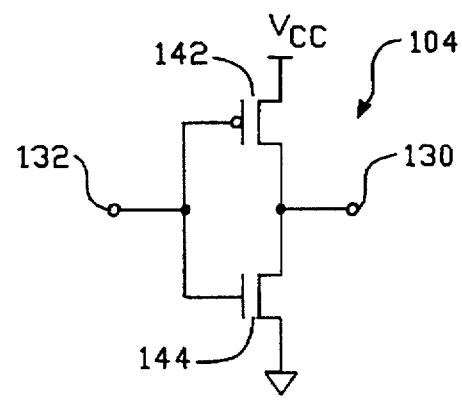
FIG. 5C is a schematic circuit diagram illustrating in more detail one embodiment of the driver 104 of FIG. 5B.

FIG. 5C is a schematic circuit diagram illustrating one embodiment of driver 104. As shown in FIG. 5C, driver 104 is an invertor comprising a P-channel transistor 142 and an N-channel transistor 144 connected in parallel between switching pin 132 (switching pin of switch 100) and node 130. As also indicated in FIG. 5C, the two transistors are connected to a power rail VCC and ground as usual. While the driver 104 is shown as an invertor, it will be understood that other driver or gate configurations may be used, such as NOR- or NAND-gates. Since the parasitic capacitance for switch 100 may be different from those of switches 20 and 40, the capacitor in FIG. 5A is labeled 30" to show that it may be different from those of switches 20 and 40.

FIG. 5D is a schematic view of the fast transmission gate switch 100 illustrating in more detail some of the more significant capacitances in the switch. Thus, the lead-to-ground capacitances of lead 124 is illustrated by capacitor 162 shown in phantom, and the lead-to-ground capacitance of lead 128 is illustrated by capacitor 164 shown in phantom. The gate to drain and gate to source capacitances are shown in phantom as capacitors 166, 168.

In the implementation indicated above and in the 1991 Data Book of Quality Semiconductor, Inc., the capacitance of switch 100 when the transistor is on is about 10 pF. Hence, the propagation delay caused by the resistance and internal capacitance of the switch, assuming a resistance value between pins 124 and 128 of about 5 ohms, is about 0.05 nanoseconds. If the bus capacitance is 50 pF, then the RC delay caused by the switch resistance of about 5 ohms and bus capacitance of 50 pF is about 0.25 nanoseconds, so that the total delay seen by a signal propagating through the switch to reach the receiver is about 0.3 nanoseconds, well below the 6.5 nanoseconds delay caused by the typical conventional buffer.

FIG. 5E is a conceptual circuit diagram illustrating the RC delay experienced by a signal propagating from node A to node B. Thus, in reference to FIG. 5E, the resistance of transistor 102 is $R_i$. The internal capacitance of the switch is $C_i$ and the bus capacitance is $C_b$, where the resistor and the two capacitors are shown in phantom since they represent the respective resistance and capacitances of the switch and bus and are not real circuit elements. Then the total RC delay caused by the switch as seen by a signal propagating from node A to node B is given by $R_i(C_i+C_b)$. As long as this total delay $R_i(C_i+C_b)$ caused by the switch 100 is less than the typical delay caused by the buffer of 6.5 nanoseconds for a 74F244 buffer driving a 50 pF load, it is advantageous to replace the buffer by the switch of this invention. Thus, for any given bus capacitance $C_b$, $R_i$ and $C_i$ are chosen so that the total delay $R_i(C_i+C_b)$ caused by the switch 100 is less than the typical delay caused by the buffer.

The above-described transmission gate switch 100 may be used advantageously to replace active logic devices such as 74F244, 74F245 for switching high speed digital logic signals in a board level design. The replacement of the active device with device 100 will greatly reduce the propagation delay, logic noise (e.g., "ground bounce" noise) and power dissipation associated with the active device replaced. Please see the "Application Note AN-01" of the 1991 Data Book of Quality Semiconductor, Inc. Switch 100 is also inherently bi-directional. Other embodiments of the switch described below in reference to FIGS. 5–8 also have similar advantages.

The fast transmission gate switch 100 may be modified by replacing transistor 102 by a P-channel transistor where the polarity of the signal for controlling the gate of the transistor has been adjusted if necessary to accommodate a P-channel device. Where the P-channel device also has the above-described channel lengths and widths, switch 100 may be constructed to have a on-resistance of not more than 10 ohms.

The gate of transistor 102 is controlled by the output of a driver 104 which may include a pair of P-channel and N-channel resistors connected in parallel between node C and the gate of transistor 102. In order to increase the speed of switching, the pair of transistors in driver 104 would preferably each have a channel length of 1.5 microns or less and channel widths greater than 200 microns. Where a driver 104 and transistor 102 are fabricated as a stand-alone integrated circuit device 100 using the same fabrication technology, the transistors in device 100 may be grown so that all the transistors in the device have short channel lengths. Where device 100 is fabricated as an integrated circuit, it can be made in the form of a package having five pins for connection to nodes A, B, C, and to power and ground.

FIG. 6 is a schematic circuit diagram of a fast transmission gate switch and of a driver and receiver to illustrate an alternative switch suitable for use in the invention. As shown in FIG. 6, switch 150 includes a pair of N-channel transistor 102 and a P-channel transistor 152 connected in parallel between nodes A, B. The gate of transistor 102 is controlled by a driver 104 as in FIG. 5 and the gate of transistor 152 is controlled by the output of the driver 154 whose input is connected to the output of driver 104. Where both transistors 102, 152 have the channel lengths and widths as those described above for transistor 102, the on-resistance of switch 150 would be 10 ohms or less.

FIGS. 7 and 8 are schematic circuit diagrams of two different fast transmission gate switches to illustrate additional alternative switches suitable for use in the invention. Bipolar transistors typically have on-resistances of less than 10 ohms so that they may be used instead of MOS transistor 102. Such configuration is illustrated in switch 200 of FIG. 7. While a npn transistor 202 is employed in switch 200, it will be understood that a pnp type transistor may be used instead and is within the scope of the invention. As shown in FIG. 7, the base of transistor 202 is controlled by the output of a driver 204 through resistor 206. Driver 204 may be one of the 7400 TTL series of logic gates, such as the 74F04 gate.

In FIG. 8, a back to back connection of two npn transistors 202 and 252 are shown for switch 250, although 2 pnp transistors may be used instead. It is known that for a bipolar transistor, unlike a MOS transistor, the current flowing between the collector and emitter is greater in one direction than the other. By placing two transistors 202, 252 in two parallel paths and connected to nodes A, B so that each node is connected to a controller of one transistor and the emitter of the other transistor (anti-parallel arrangement), currents will flow through the path of lesser resistance in each direction so that the amount of current that needs to be pumped through the switch is reduced.

FIG. 9 is a schematic circuit diagram of a CMOS switch device employing multiple transistor switches for switching signals between two sets of data lines. Quality Semiconductor, Inc. of Santa Clara, Calif., assignee of the present application, has employed a switch device like that shown in FIG. 9 as a bus switch in product 74FCT3384. As shown in FIG. 9, switch device 500 is a high speed TTL bus connect device. When enabled, the bus switch device directly connects two buses with the connection resistance of less than 5 ohms. The five lines A0, A1, A2, A3, A4 in bus A are each connected through a transistor 102 to the bus lines B0, B1, B2, B3, B4 respectively. The five transistors 102 connecting A0–A4 to B0–B4 have their gates controlled by the output of driver 104'. Similarly, the five lines A5–A9 in bus A are connected to the respective one of the five bus lines B5–B9 in bus B through transistors 102 whose gates are controlled by the outputs of a driver 104". Thus switch device 500 includes ten switches 102 arranged as two banks of five and controlled by two different drivers. This allows switch device 500 to be used as a 10-bit switch or as a 5-bit, 2-to-1 multiplexer. This is accomplished by electrically connecting the pairs of lines B0–B5, B1–B6, B2–B7, B3–B8 and B4–B9. In such event, when the output of driver 104' is high, the signals present on lines A0–A4 will be transmitted to the B bus whereas if the output of driver 104" is high, the signals present on lines A5–A9 will be transmitted to the B bus instead to accomplish the 2-to-1 multiplexer function. When the output of one of the two drivers is low, the transistors driven by the driver will be turned off and the respective bus lines connected by such transistors will be disconnected from one another. The above-described function is summarized in the Function Table below.

FUNCTION TABLE

| BEA | BEB | B0–4 | B5–9 Function |
| --- | --- | --- | --- |
| H | H | Hi-Z | Hi-ZDisconnect |
| L | H | A0–4 | Hi-ZConnect |
| H | L | Hi-Z | A5–9Connect |
| L | L | A0–4 | A5–9connect |

Device 500 includes in essence ten switches, where each switch includes an N-channel MOS transistor driven by a CMOS gate. When the switch is enabled, the gate of the N-channel transistor is at Vcc (+5 volts) and the device is on. These devices have an on resistance of less than 5 ohms for voltages near ground and will drive in excess of 64 mA each. The resistance rises somewhat as the I/O voltage rises from a TTL low of 0.0 volts to a TTL high of 2.4 volts. In this region the A and B pins are solidly connected, and the bus switch is specified in the same manner as a TTL device over this range. As the I/O voltage rises to approximately 4.0 volts, the transistor turns off. This corresponds to a typical TTL high of 3.5 to 4.0 volts.

Figure 10:
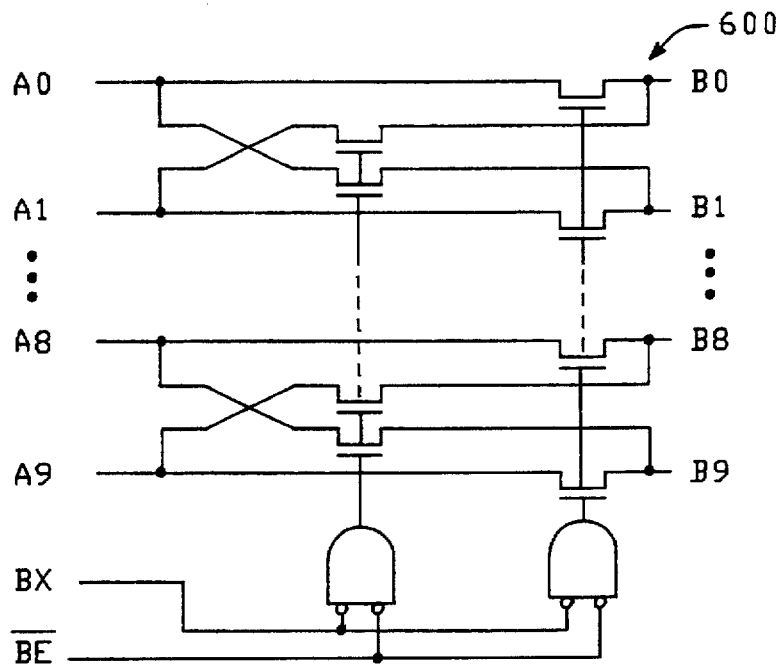
FIG. 10 is a schematic circuit diagram of a bus exchange switch.

FIG. 10 is a schematic circuit diagram of a CMOS bus exchange switch 600 in another product 74FCT3383. Switch 600 comprises two banks of ten switches arranged to gate through or exchange two banks of five signals. This allows switch 600 to be used as a 10-bit switch or as a 5-bit, two-way bus exchange device. Switch 600 is particularly useful for exchange and routing operations such as byte swap, crossbar matrices, and RAM sharing. The functions of switch 600 are summarized in the Table below.

FUNCTION TABLE

| BE | BX | B0–8 | B1–9Function |
| --- | --- | --- | --- |
| H | X | Hi-Z | Hi-ZDisconnect |
| L | L | A0–8 | A1–9Connect |
| L | H | A1–9 | A0–8Exchange |

Figure 11A:
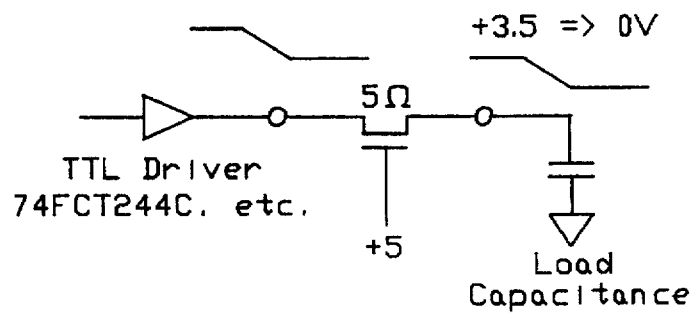
FIGS. 11A, 11B are schematic circuit diagrams illustrating the operation of the circuit in FIGS. 5A–5D.
Figure 11B:
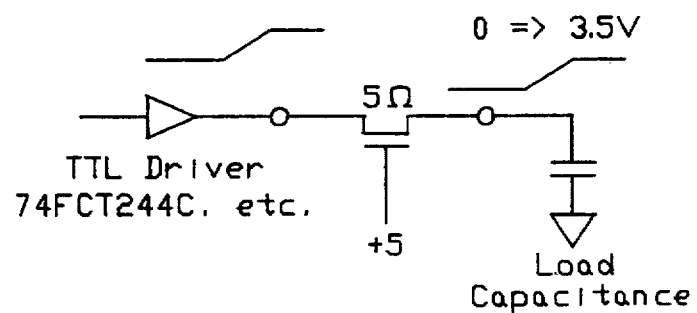

The bus switch provides a path for a driving device to drive capacitance to ground and to drive capacitance up from ground. This is shown in FIGS. 11A, 11B. When the A (or B) input is driven to a TTL low of 0.0 volts, the N-channel transistor is fully on and the B (or A) output will follow it. Likewise, when the A (or B) input is driven from a TTL low of 0.0 volts, the switch is fully on and the B (or A) output will follow it through threshold and beyond. This means that the rise and fall time characteristics and waveforms of the B (or A) output will be determined by the TTL driver, not the bus switch. The switch introduces insignificant propagation delay.

When the bus switch is disabled, the N-channel transistor gate is at 0.0 volts, and the transistor is off. By the nature of the N-channel transistor design, the A and B pins are fully isolated when the transistor is off. Leakage and capacitance is to the chip substrate (i.e., ground) rather than between input and output. This minimizes feedthrough in the off state. Because only an N-channel transistor is used, either A or B pin(s) can be taken to Vcc and above, and the device can be powered down without loading either bus.

The above-described fast transmission gate switches have both low on resistances and internal capacitances as well as fast turning on and off times. Where the transistors in the drivers 104 (and of drivers 104', 104") have channel lengths of 1.5 microns or less and channel widths of 200 microns or more, and the gate to drain and source capacitances of transistor 102 are of the order of 1 or 2 pF, transistor 102 can be turned on or off upon the application of a switching signal to node C in a just a few nanoseconds, in any event less than 7 nanoseconds.

Figure 12:
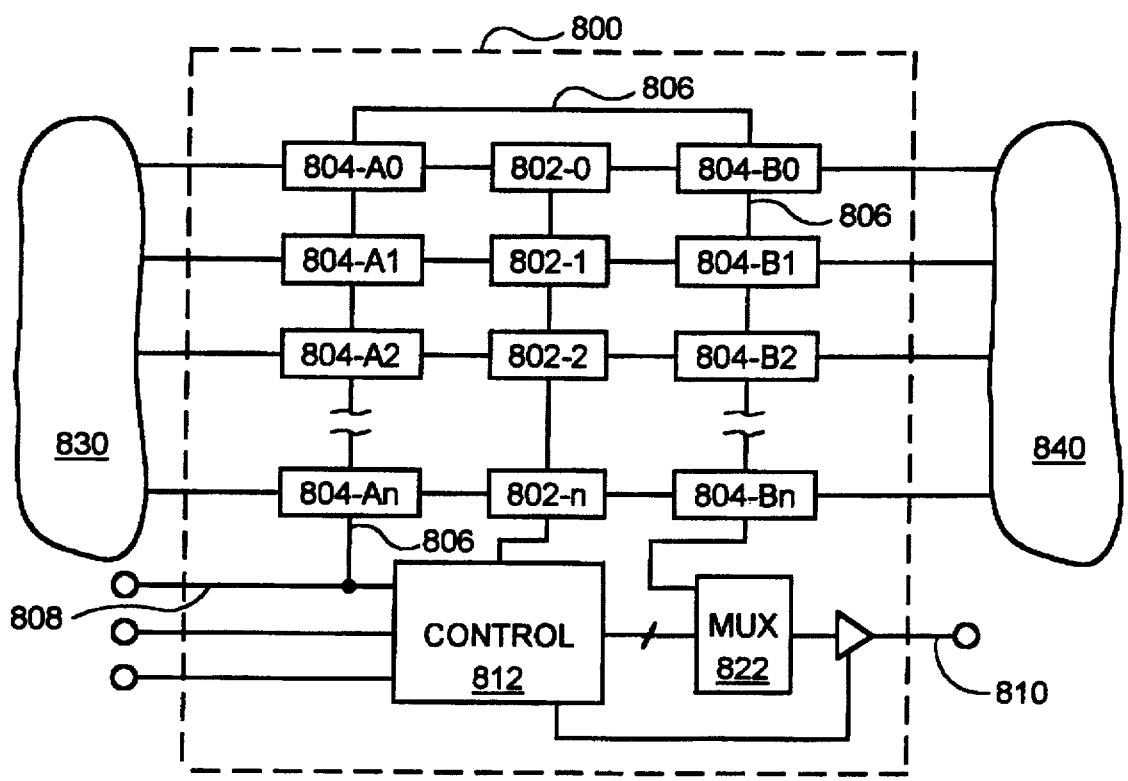
FIG. 12 is a block diagram of a buffer device incorporating fast transmission gates in accordance with the present invention.

Buffer Device in Accordance with IEEE 1149.1 Standard Incorporating Fast Transmission Gate Switch Referring to the illustrative drawing of FIG. 12, there is shown a block diagram of an integrated circuit buffer device 800 in accordance with the present invention. The device is constructed to meet the requirements of the IEEE 1149.1 standard. Thus, the overall architecture is not novel, and no claim is made to the overall architecture per se. However, the use of fast transmission gate switches to selectively interconnect scan cells in an IC constructed is not taught by the IEEE 1149.1 standard.

The buffer device 800 includes a number of data pins A0, A1, A2 ... An and B0, B1, B2 ... Bn. Data pins A0 ... An are disposed along one side of the device, and data pins B0 ... Bn are disposed along the other side. Multiple fast transmission gate switch transistors/register latch circuits 802-0 through 802-n are disposed within the device. A fast transmission gate switch transistor within circuit 802-0 can be used to selectively open or close the data path between data pin A0 and data pin B0, for example. Similarly, a fast transmission gate switch transistor within circuit 802-1 can be used to selectively open or close a data path between data pin A1 and B1, and a fast transmission gate switch transistor within circuit 802-n can be used to selectively open or close a data path between data pin An and data pin Bn.

Multiple data scan/storage cells 804-A0 ... 804An and 804-B0 ... 804Bn are disposed within the device. The scan/storage cells can be used to sense data on respective data pins or to force data onto respective data pins. In the present embodiment, there is a storage cell for each data pin. Scan/storage cell 804-A0 can be used to sense data on data pin A0; or it can be used to force a data value onto data pin A0, for example. Likewise, scan/storage cell 804-Bn can be used to sense data on data pin Bn; or it can be used to force a data value onto data pin Bn. Thus, there are 2n scan/storage cells for the 2n data pins. Each data cell can store digital data which is sensed on a respective data pin or can force digital data onto a respective data pin. The respective data pins and the respective scan/storage cells can be operationally connected on a serial digital path 806 which extends from test input pin 808 to test output pin 810.

In operation, the buffer device 800 can be disposed between two external devices 830 and 840. For example, the data pins on one side of the device A0 ... An can be connected to terminals of a first device to be tested 830. The data pins on the other side of the device 800 can be connected to data pins of the second device under test 840.

During non-test mode operation, the fast transmission gate switches within circuits 802-0 through 802-n are closed, and the serial data path 806 is non-operational. Digital information can be communicated bidirectionally between the first external device 830 and the second external device 840.

During test mode operation, the fast transmission gate switches within circuits 802-0 through 802-n can be opened. The serial data path 806 can be used to serially shift test data into the various scan/storage cells to force data onto corresponding data pins, for example. Specifically, for example, digital information loaded into scan cell 804-A2 can be used to force a desired digital value onto data pin A2. Specifically, if the switch in circuit 802-2 is opened, then the value in cell 804-A2 can be forced onto data pin A2 but not onto pin B2. The response of the first external device 830 to the digital value forced onto pin A2 then can be observed.

Alternatively, for example, the first external device 830 can be operated, and at appropriate time junctures, the data on data pins A0 . . . An can be sensed and loaded into respective scan cells 804-A0 through 804An. That data then can be serially shifted out on the serial digital path 806 via output test terminal 810 for evaluation. The switches in circuits 802-0 through 802-n can isolate the data pins A0 . . . An from data pins B0 . . . Bn. If the respective switches in circuits 802-0 through 802-n are opened when the data on data pins A0 ... An are sensed, then any data values on data pins B0 . . . Bn will not influence the data values sensed and scanned into cells 804-B0 through 804-Bn.

In the test mode data can be serially shifted from a test data input terminal 808 into the scan cells. For example, a data bit could be shifted in sequence first to cell 804-An, then to cell 804-An-1 and ultimately, on to cells 804-A1, 804-A0, and from there, it could be shifted in sequence from cell 804-B0 to cell 804-Bn. When the data bit arrived at cell 804-Bn it then could be used to "force" a value onto data pin Bn. Alternatively, for example, a data bit sensed at data pin A1 and stored in cell 804-A1 could then be shifted in sequence to cell 804-A0 and on to cells 804-B0 through 804-Bn whereupon it could be shifted out onto the data output terminal 810.

Figure 13:
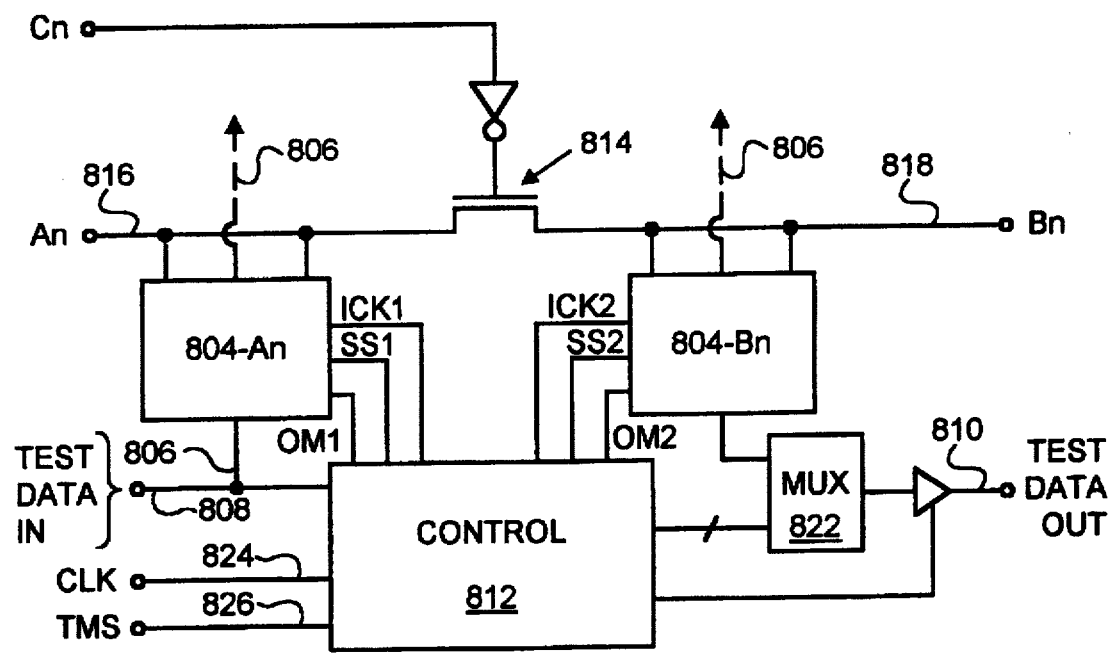
FIG. 13 is a more detailed block diagram of a portion of the buffer device of FIG. 12 showing additional details of the control lines used to control the scan/storage cells and showing a representative fast transmission gate switch.

Also shown in FIG. 12 is control logic 812 used to control the operation of the serial digital path and the operation of the scan/storage cells. Referring to FIG. 13, there is provided a more detailed block diagram showing the interconnection of the control logic 812 with scan cells 804-An and 804-Bn and a representative fast transmission gate switch 814. It will be appreciated, of course, that the overall operation of the entire digital path and the remainder of the scan/storage cells will be appreciated from the explanation of the operation of scan cells 804-An and 804-Bn and the operation of switch 814 shown in FIG. 13.

FIG. 13 illustrates the use of a fast transmission gate switch 814 in a buffer device 800 that meets the requirements of IEEE 1149.1. The switch is responsive to at least one external on/off control signal applied at Cn, and includes a first input/output node An and a second input/output node Bn. The switching device is operative to pass or block the bidirectional transmission of external data signals between the node An and the node Bn. The switching device 800 comprises a bidirectional fast transmission gate field-effect transistor 814 including a first input/output terminal and a second input/output terminal and a gate terminal. Terminal An is connected to data path 816 and terminal Bn forming a second data path 818. The transistor passes bidirectional external data signals between pins An and Bn when the transistor 814 is turned on and blocks the passage of external data signals between pins An and Bn when said transistor 814 is turned off.

An external terminal Cn for receiving the at least one external on/off control signal and a driver circuit 820 provide an internal on/off control signal to the gate terminal of the field-effect transistor 814.

In accordance with IEEE 1149.1, a first scan/storage cell 804-An is connected to the first data pin An and is operative to sense and store data signals from data pin An. A second scan/storage cell 818 is connected to the second data path 818 and is operative to sense and store data signals from said second data pin Bn.

The first embodiment of the present invention also comprises a test data input node 808 and a test data output node 810. The scan/storage cell means 804-n receives data from the test data input node 808. The scan/storage cell 804-Bn is connected to the test data output node 810 via multiplexer 820. The multiplexer 820 allows the scan/storage cell 804-Bn to be bypassed and other signals to be output through test data output node 810.

As described above, each scan cell has at least two modes of operation, a sense mode and a shift mode. When operating in sense mode the scan/storage cell 804-An senses and stores data signals from the first data pin An, and the second scan/storage cell 804-Bn senses and stores data signals from the second data pin Bn.

A clock signal is provided to the control logic 812 through the test clock node 824 and a test mode select signal is provided to the control logic means through the test mode node 826. The control logic means generates and provides an internal clock signal ICK1, ICK2 and a shift select signal SS1, SS2 to each scan/storage cell 804-An through 804-Bn. Each scan cell means senses and stores a new data signal only during transitions in its respective internal clock signal ICK1, ICK2, and each scan cell operates in shift mode only when its respective shift select signal SS1, SS2 has a predetermined shift value. In the preferred embodiment, the shift value is a low voltage or logical "0" applied to the scan cell means.

The scan cell may also be used to force data values on the data paths. Each scan cell has an output data value, and the control logic generates and provides an output mode signal OM1, OM2 to each scan cell.

Scan cell 804-An forces data pin An to have a data value equal to the output data value of scan cell 804-An when that scan cell's output mode signal has a predetermined force value. In the preferred embodiment, the force value is a high voltage or logical "1" applied to the scan cell.

Similarly, scan cell 804-Bn forces the data pin Bn to have a data value equal to the output data value of scan cell 804-Bn that when scan cell's output mode signal has a predetermined force value. In the preferred embodiment, the force value is a high voltage or logical "1" applied to the scan cell.

Thus, depending upon the internal control signals generated by the control logic 812, the scan cell may be serially loaded with data from the test data input node, or may sense and store data from their respective data paths. The data stored in the scan cells may also be serially shifted out the test data output node and the scan cell's output values may be used to force the data paths to the same data value.

Figure 14:
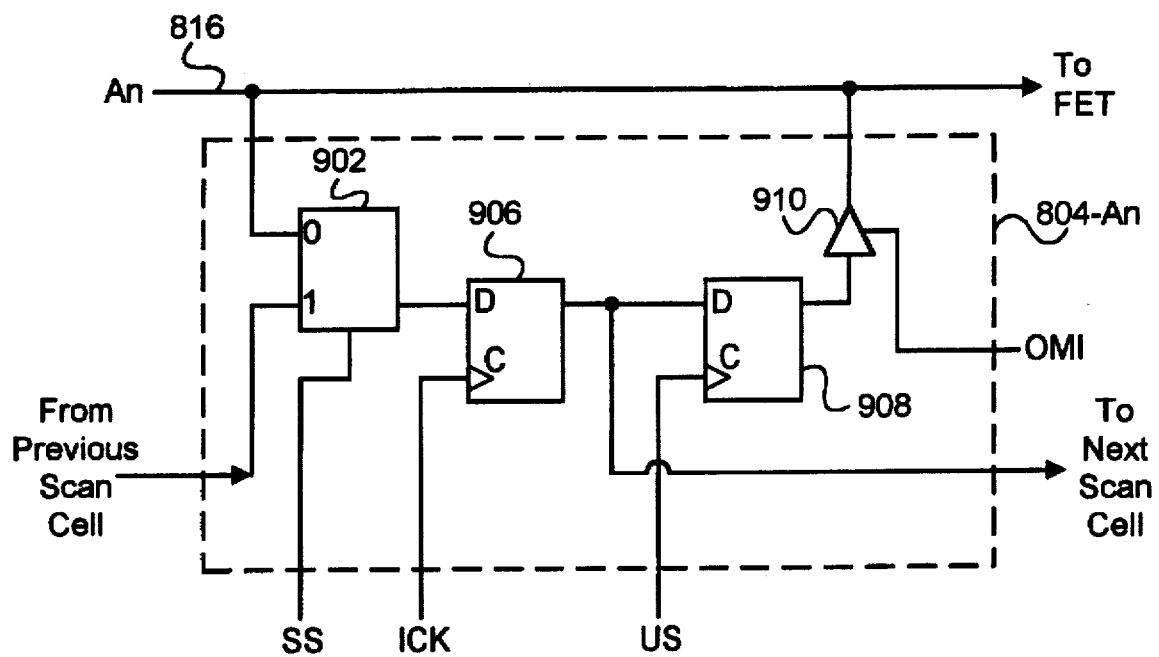
FIG. 14 is a schematic diagram of a scan/storage cell of the buffer device of FIGS. 12 and 13.

The implementation of the scan cells is well-known to the prior art. For example, an implementation is described in National Semiconductor, IEEE 1149.1—1990 Seminar Handbook (1992 Edition). FIG. 14 illustrates an exemplary scan cell 804-An, although one of ordinary skill in the art will realize that there are many other possible embodiments for sensing and storing data signals in compliance with IEEE 1149.1. Referring to FIG. 14, a multiplexer 902 is used to select among data inputs to the scan cell. One data input is the data signal from the data path 816, and the other data input is a data signal from a previous scan cell in the serial data path. The first scan cell in the serial data path has this input connected to the test data input node instead of a previous scan cell. The shift select signal SS is applied to the multiplexer 902 and determines which input is read into the scan cell. When SS has a low voltage or logical "0" value, the data signal from data path 816 is passed by the multiplexer and the data signal from the previous scan cell is blocked. When SS has a high voltage or logical "1" value, the data signal from the previous scan cell is passed by the multiplexer and the data signal from the data path 904 is blocked. The multiplexer output is provided as the data input to data latch 906. The internal clock signal ICK is provided to the clock input of the data latch. The data input of the data latch is sensed and stored in the data latch during the rising edge transition in the internal clock signal ICK. The data value stored in data latch 906 is output to update latch 908 and provided to the next scan cell in the serial data path. The last scan cell provides this output to the test data output node. An update signal US is generated by the control logic means and provided to the clock input of the update latch. The update latch 908 will sense and store the output of the data latch 906 during the rising edge transition in the update signal US. The update latch provides its output value as data input to switch 910. The output mode signal OM from the control logic means controls the switch. In the preferred embodiment, when the output mode signal OM has a high voltage or logical "1" value, the data path 816 is forced to a value equal to the output of the update latch. When the output mode signal OM has a low voltage or logical "0" value, the update latch 908 has no effect on data path 816.

It is apparent to one of ordinary skill in the art that other embodiments may be used for scanning values for serially testing. For instance, the latches could be designed to operate on the falling edge transition of clock signals. In addition, the switch 910 could be replaced by a multiplexer that passes either the data signal from data path 904 or the output from the update register 906. In addition, a minimally operative serial test device could be designed without an update register and switch for forcing values onto the data path 816.

Figure 15:
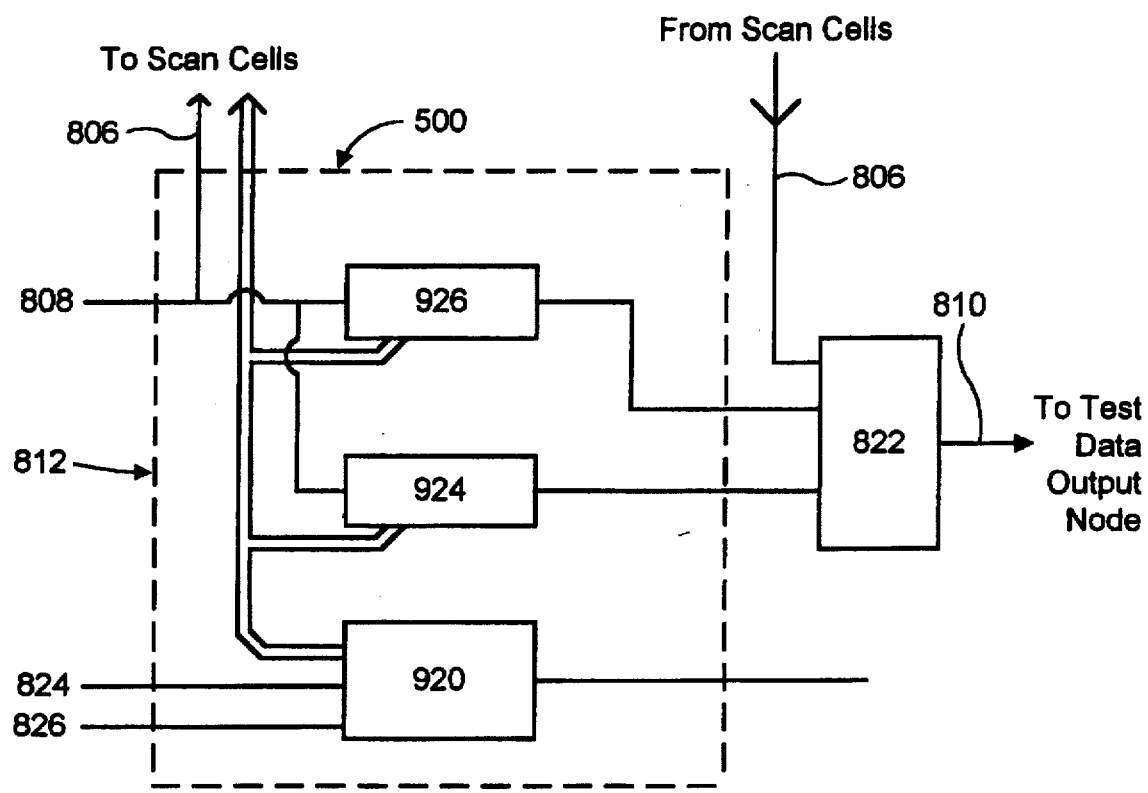
FIG. 15 is a block diagram showing additional details of the control logic of the buffer device of FIGS. 12 and 13.

The implementation of the control logic 812 is well-known to the prior art. Representative control logic is described in National Semiconductor, IEEE 1149.1—1990 Seminar Handbook (1992 Edition). Referring to FIG. 15, the control logic 812 is responsive to signals from the test data input node 808, the clock node 824, and the test mode node 826. The control logic 812 includes a test access port 920, an instruction register 924, and a bypass register 926.

Figure 16:
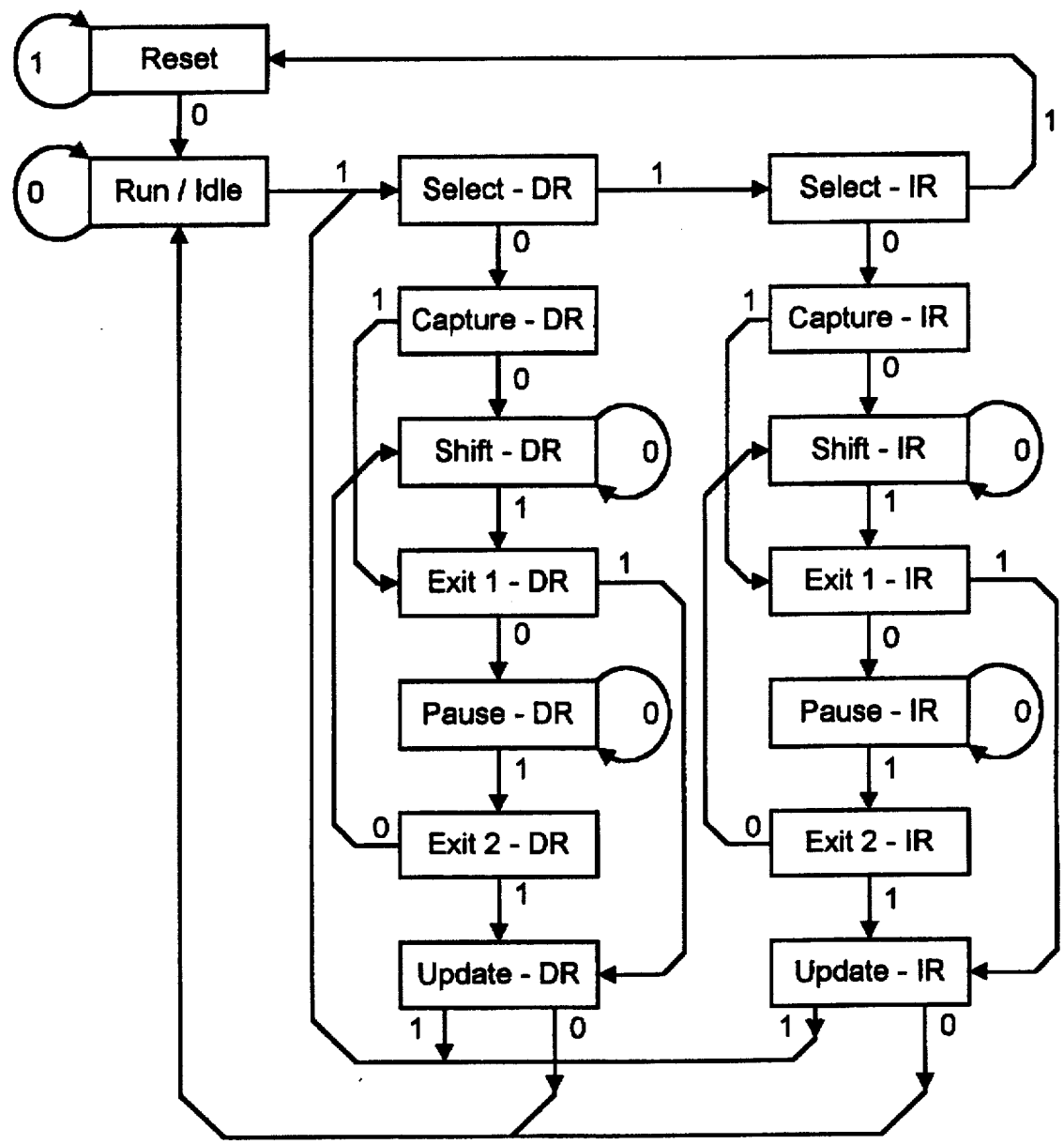
FIG. 16 is a state diagram which illustrates the operation of the test access port of the control logic of FIG. 15.

The test access port (TAP) 920 implements a 16-state finite state machine which provides internal control signals to the scan cells, the bypass register, and the instruction register. The state diagram for the test access port is illustrated in FIG. 16. Referring to FIGS. 15 and 16, movement through the state machine is controlled by a test mode select signal (TMS) applied at the test mode node 826 a set-up time prior to the rising edge of the clock signal applied at the clock node 824. The 1s and 0s shown adjacent to each state transition arc show the value of TMS that must be present on the test mode node at the time of the next rising edge of the clock signal for that transition. The instruction register is selected for shifting if the current state is one of the seven in the right hand column of FIG. 16. A value may be shifted serially into the instruction register from the test data input node or a fixed value may be loaded in parallel. The instruction register is selected if upon transition from the SELECT-IR state, TMS is 0. Then the CAPTURE-IR state is entered. If TMS is 1, a predetermined value is loaded in parallel into the instruction register. Otherwise, the SHIFT-IR state is entered. As long as TMS is 0 the TAP remains in the SHIFT-IR state. In this state data is serially shifted into the instruction register on the rising edge of the clock signal from the test data input node. When parallel loading or shifting is completed, the EXIT1-IR state is entered and if TMS is 0, a PAUSE-IR state is entered to allow a delay and synchronization with other equipment. When any pause is completed, the state machine enters another exit state EXIT2-IR. If TMS is 0, the machine returns to the SHIFT-IR state. In either exit state, if TMS is 1 the state machine enters the UPDATE-IR state. During the UPDATE-IR state, the value loaded into the instruction register is loaded into data latches for preserving the current instruction until a new instruction value is loaded or shifted in.

The value loaded into the instruction register 924 determines which registers will be active during testing. For instance in FIG. 15, the instruction register may select the bypass register 926 or the serial data path defined by the scan cells attached to the functional input/output nodes. IEEE 1149.1 allows optional additional registers to be added and selected for custom testing. When the bypass register 926 is selected data may be shifted from the test data input node to the test data output node bypassing the serial data path defined by the scan cells. When the serial data path defined by the scan cells is selected, data may be loaded in parallel from the various data paths attached to the input/output nodes or serially shifted from the test data input node serially through the scan cell means to the test data output node. The behavior of the selected register is controlled by the TAP states on the left hand column of FIG. 16. The states are similar to the instruction register states. When TMS is 1 upon transition from the CAPTURE-DR state, data may be loaded in parallel to the scan cells. Referring to FIG. 14, in this case, the shift select signal SS will be a logical "0" and data will be loaded from the data path 816. Referring to FIGS. 14 and 16, during the SHIFT-DR state while TMS is 0, the shift select signal SS will be a logical "1" and data will be serially shifted into the scan cell from the previous scan cell. After data has been loaded in parallel or serially, the UPDATE-DR state is entered. This state causes a rising edge transition in the update signal US in FIG. 14. The current value of the scan cell means is loaded into the update latch and stored until a new value is loaded in parallel or serially into the scan cell means.

In FIG. 15, the multiplexer 822 is used to select the output to be sent to the test data output node 810. When the instruction register 924 is selected by the TAP state machine, its output is selected. When the bypass register 926 is selected, its output is passed to the test data output node 810. When the serial data path defined by the scan cells is selected, the output from the last scan cell is passed to the test data output node 810.

While a particular embodiment of the invention has been disclosed, it will be readily apparent to those skilled in the art that numerous other modifications and variations not mentioned above can still be made without departing from the spirit and scope of the invention as claimed below.

What is claimed is:

1. A scan test device comprising:

a bidirectional field-effect transistor including a first input/output terminal and a second input/output terminal and a gate terminal, said first input/output terminal being connected to a first node forming a first data path and said second input/output terminal being connected to a second node forming a second data path, such that said bidirectional field-effect transistor passes bidirectional external data signals between said first and second nodes when said bidirectional field-effect transistor is turned on and blocks the passage of external data signals between said first and second nodes when said bidirectional field-effect transistor is turned off;

wherein said bidirectional field-effect transistor has a channel length of no more than 1.5 microns and has a channel width of no less than 1000 microns, such that said bidirectional field-effect transistor exhibits a time constant of no more than 5 nanoseconds;

a driver circuit for providing an on/off control signal to said gate terminal of said bidirectional field-effect transistor; and first scan cell means operatively connectable to said first data path and operative to sense or store data signals from said first data path;

second scan cell means operatively connectable to said second data path and operative to sense or store data signals from said second data path.

2. The device according to claim 1, further comprising:

a test data output node; wherein the first scan cell means is connected to the second scan cell means, and the second scan cell means is connected to the test data output node; and wherein each scan cell means has at least two modes of operation, a sense mode and a shift mode;

such that when operating in the sense mode the first scan cell means senses and stores data signals from said first data path, and the second scan cell means senses and stores data signals from said second data path; and when operating in the shift mode the first scan cell means outputs data signals to said second scan cell means, and the second scan cell means senses and stores data signals from said first scan cell means and outputs data signals to said test data output node such that the first and second scan cell means and the test data output node form a serial data path when operating in the shift mode, the serial data path capable of being used to serially shift to the test data output node data signals stored by the scan cell means.

3. The device according to claim 2, further comprising:

a test data input node; wherein the first scan cell means is connected to the test data input node:

when operating in the shift mode, the first scan cell means senses and stores data signals from said test data input node such that data signals are serially shifted from the test data input node into the first scan cell means.

4. The device according to claim 3, further comprising a test clock node, a test mode node, and control logic means for generating internal control signals;

wherein the control logic means is connected to the test data input node, the test clock node, the test mode node, and each scan cell means;

a clock signal is provided to the control logic means through the test clock node and a test mode select signal is provided to the control logic means through the test mode node;

the control logic means generating and providing an internal clock signal and a shift select signal to each scan cell means;

each scan cell means sensing and storing a new data signal only during transitions in each scan cell means' respective internal clock signal; and each scan cell means operating in the shift mode only when each scan cell means' respective shift select signal has a predetermined shift value;

the clock signal and the test mode select signal thereby controlling the operation of the scan cell means.

5. The device according to claim 3, wherein each scan cell means has an output data value;

the control logic means generates and provides an output mode signal to each scan cell means;

wherein the first scan cell means forces the first data path to have a data value equal to the first scan cell means' output data value when the first scan cell means' output mode signal has a predetermined force value; and the second scan cell means forces the second data path to have a data value equal to the second scan cell means' output data value when the second scan cell means' output mode signal has a predetermined force value.

6. A scan test device comprising:

multiple respective field-effect transistors, each including a respective first input/output terminal and a respective second input/output terminal and a respective gate terminal, each respective first input/output terminal being connected to a respective first input/output node forming a respective first data path and each respective second input/output terminal being connected to a respective second input/output node and forming a respective second data path, such that each respective field-effect transistor respectively passes bidirectional individual external data signals between respective individual first and second input/output nodes when said respective field-effect transistor is turned on and respectively blocks the passage of individual external data signals between respective individual first and second input/output nodes when said respective field-effect transistor is turned off;

wherein each respective field-effect transistor has a channel length of no more than 1.5 microns and has a channel width of no less than 1000 microns such that each respective field-effect transistor exhibits a time constant of no more than 5 nanoseconds; and at least one driver circuit including a respective external terminal for receiving the at least one respective external on/off signal;

wherein the at least one driver circuit provides a respective internal on/off control signal to respective control terminals of at least two of said respective field-effect transistors; and multiple respective first scan cell means, there being at least one first scan cell means connected to each respective first data path and operative to sense and store data signals from each respective first data path, and multiple respective second scan cell means, there being at least one scan cell means connected to each respective second data path and operative to sense and store data signals from each respective second data path.

7. The device according to claim 6, further comprising:

a test data output node; wherein each respective first scan cell means is connected to the next respective first scan cell means, the last respective first scan cell means is connected to the first respective second scan cell means, each respective second scan cell means is connected to the next respective second scan cell means, the last respective second scan cell means is connected to the test data output node;

wherein each scan cell means has at least two modes of operation, a sense mode and a shift mode;

when operating in the sense mode each respective first scan cell means senses and stores data signals from each respective first scan cell means' respective first data path, and each respective second scan cell means senses and stores data signals from each respective second scan cell means' respective second data path; and when operating in the shift mode each respective first scan cell means except the last respective first scan cell means outputs data signals to the next respective first scan cell means, and each respective first scan cell means beyond the first respective first scan cell means senses and stores data signals from the previous respective first scan cell means, the last respective first scan cell means outputs data signals to the first respective second scan cell means, the first respective second scan cell means senses and stores data signals from said last respective first scan cell means, each respective second scan cell means except the last respective second scan cell means outputs data signals to the next respective second scan cell means, each respective second scan cell means beyond the first respective second scan cell means senses and stores data signals from the previous respective second scan cell means, the last respective second scan cell means outputs data signals to said test data output node;

such that the first and second scan cell means and test data output node form a serial data path when operating in shift mode, the serial data path capable of being used to serially shift to the test data output node data signals stored by the scan cell means.

8. The device according to claim 7, further comprising:

a test data input node;

the first respective first scan cell means is connected to the test data input node;

when operating in the shift mode, the first respective first scan cell means senses and stores data signals from said test data input node such that data signals are serially shifted from the test data input node into the first respective first scan cell means.

9. The device according to claim 8, further comprising a test clock node, a test mode node, and control logic means for generating internal control signals;

wherein the control logic means is connected to the test data input node, the test clock node, the test mode node, and each scan cell means;

a clock signal is provided to the control logic means through the test clock node and a test mode select signal is provided to the control logic means through the test mode node;

the control logic means generating and providing an internal clock signal and a shift select signal to each scan cell means;

each scan cell means sensing and storing a new data signal only during transitions in each scan cell means' respective internal clock signal; and each scan cell means operating in the shift mode only when each scan cell means' respective shift select signal has a predetermined shift value;

the clock signal and the test mode select signal thereby controlling the operation of the scan cell means.

10. The device according to claim 9, wherein each scan cell means has an output data value;

the control logic means generates and provides an output mode signal to each scan cell means;

wherein each respective first scan cell means forces each respective first scan cell means' respective first data path to have a data value equal to the respective first scan cell means' output data value when the respective output mode signal has a predetermined force value;

each respective second scan cell means forces each respective second scan cell means' respective second data path to have a data value equal to the respective second scan cell means' output data value when the respective output mode signal has a predetermined force value.

* * * * *